United States Patent

Klara et al.

[11] Patent Number: 5,331,216
[45] Date of Patent: Jul. 19, 1994

[54] HIGH SPEED MULTIPLEXER

[75] Inventors: Walter S. Klara, Hopewell Junction; Frank A. Montegari, Wappingers Falls; Gordon S. Sager, Salt Point, all of N.Y.

[73] Assignee: International Business Machines Corporation, Armonk, N.Y.

[21] Appl. No.: 973,891

[22] Filed: Nov. 10, 1992

[51] Int. Cl.⁵ ............................................. H03K 17/62
[52] U.S. Cl. ............................ 307/243; 307/254; 307/475
[58] Field of Search ............... 307/241, 243, 264, 254, 307/475

[56] References Cited

U.S. PATENT DOCUMENTS

| | | |
|---|---|---|
| 3,194,985 | 7/1965 | Smith, Jr. et al. |
| 3,639,781 | 2/1972 | Marley . |
| 3,783,307 | 1/1974 | Breuer . |
| 4,354,266 | 10/1982 | Cooperman et al. |
| 4,532,440 | 7/1985 | Barre . |
| 4,572,967 | 2/1986 | Metz . |
| 4,686,674 | 8/1987 | Lam . |
| 4,695,749 | 9/1987 | Lam . |
| 4,835,771 | 5/1989 | Moussie . |
| 4,963,767 | 10/1990 | Sinh . |
| 4,978,924 | 12/1990 | Schuster ............... 307/243 |
| 5,045,804 | 9/1991 | Sugawara et al. .......... 307/243 |
| 5,148,121 | 9/1992 | Uchida ................... 307/243 |

Primary Examiner—John Zazworsky
Attorney, Agent, or Firm—Whitham, Curtis & Whitham

[57] ABSTRACT

A high speed bipolar multiplexer circuit adds less than ten picoseconds delay to the data or test paths. The multiplexer circuit incorporates a low gain linear amplifier which is completely stable and compensates for any level losses through the input emitter followers. The minimal delay introduced in the system data paths and the good isolation between system data inputs and test data inputs matches the performance of the logic and memory circuits of the chips in which multiplexer circuits are incorporated.

6 Claims, 3 Drawing Sheets

HIGH SPEED MULTIPLEXER

BACKGROUND OF THE INVENTION

1. Field of the Invention

The present invention generally relates to signal multiplexers and, more particularly, to a high speed multiplexer which minimizes signal delay and produces no loss of signal levels. The multiplexer according to the invention has particular application in high speed logic and memory circuits which incorporate scan test inputs requiring good isolation between system data and test data inputs.

2. Description of the Prior Art

A multiplexer is an electronic switch that connects one of two or more signal sources to a load. In one particular application, a multiplexer is used in a logic or memory chip that requires its receiving circuits to accept either system data inputs or test data inputs. Although the multiplexer function for this application can be easily performed using conventional logic circuits, the delay introduced into the system data paths would be intolerable for high performance logic and memory chips. What is needed for these high performance chips is a multiplexer circuit which, in the system mode, introduces a minimal delay in the system data paths and provides good isolation between system data inputs and test data inputs. The multiplexer circuit should be a high performance circuit, matching the performance of the logic and memory circuits of the chips in which they are incorporated, and preferably insure no signal loss between input and output terminals.

SUMMARY OF THE INVENTION

It is therefore an object of the present invention to provide a high speed multiplexer circuit which has minimum delay in the data paths and produces no loss of signal levels.

According to the invention, there is provided a high speed multiplexer circuit which adds less than ten picoseconds delay to the data or test paths. The multiplexer circuit incorporates a low gain linear amplifier which is completely stable and compensates for any level losses through the input emitter followers.

In a preferred implementation, the high speed bipolar multiplexer circuit of the invention comprises first, second, third, and fourth bipolar transistors. The first and second transistors have a common emitter connection and the third and fourth transistors have a common emitter connection. The collectors of the first and third transistors are connected to a source of voltage. The base of the first transistor is connected to a first input terminal, the base of the third transistor is connected to a second input terminal, and the bases of the second and fourth transistors are connected in common. Fifth and sixth transistors have a common emitter connection, with the fifth transistor having its collector connected to the common emitter connection of the first and second transistors and the sixth transistor having its collector connected to the common emitter connection of the third and fourth transistors. The base of the fifth transistor is connected to first mode selection terminal, and the base of the sixth transistor is connected to a second mode selection terminal. A current source transistor is connected between the common emitter connection of said fifth and sixth transistors and circuit ground, and a current mirror transistor connected in series with a first resistor between the source of voltage and circuit ground. The current mirror transistor has a common base connection with the current source transistor to drive the current source transistor. A low-gain, linear amplifier includes a seventh transistor and a voltage divider. The voltage divider is connected between the source of voltage and the common collector connection of the second and fourth transistors. The seventh transistor has an emitter connected to the common connection of the collectors of the second and fourth transistors, a collector connected to an output terminal and through a portion of the voltage divider to said source of voltage, and a base connected to a first tap of the voltage divider establishing a bias level for the seventh transistor. The bases of the second and fourth transistors are connected to a second tap of the voltage divider to establish a bias level for the second and fourth transistors. The first, second and seventh transistors are always in a conductive state when said multiplexer is in a first mode of operation thereby minimizing a signal delay from the first input terminal to the output terminal since no switching threshold needs to be overcome. When the multiplexer is in a second, or test, mode of operation, the first transistor is non-conductive thereby isolating the first input terminal from the output terminal.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
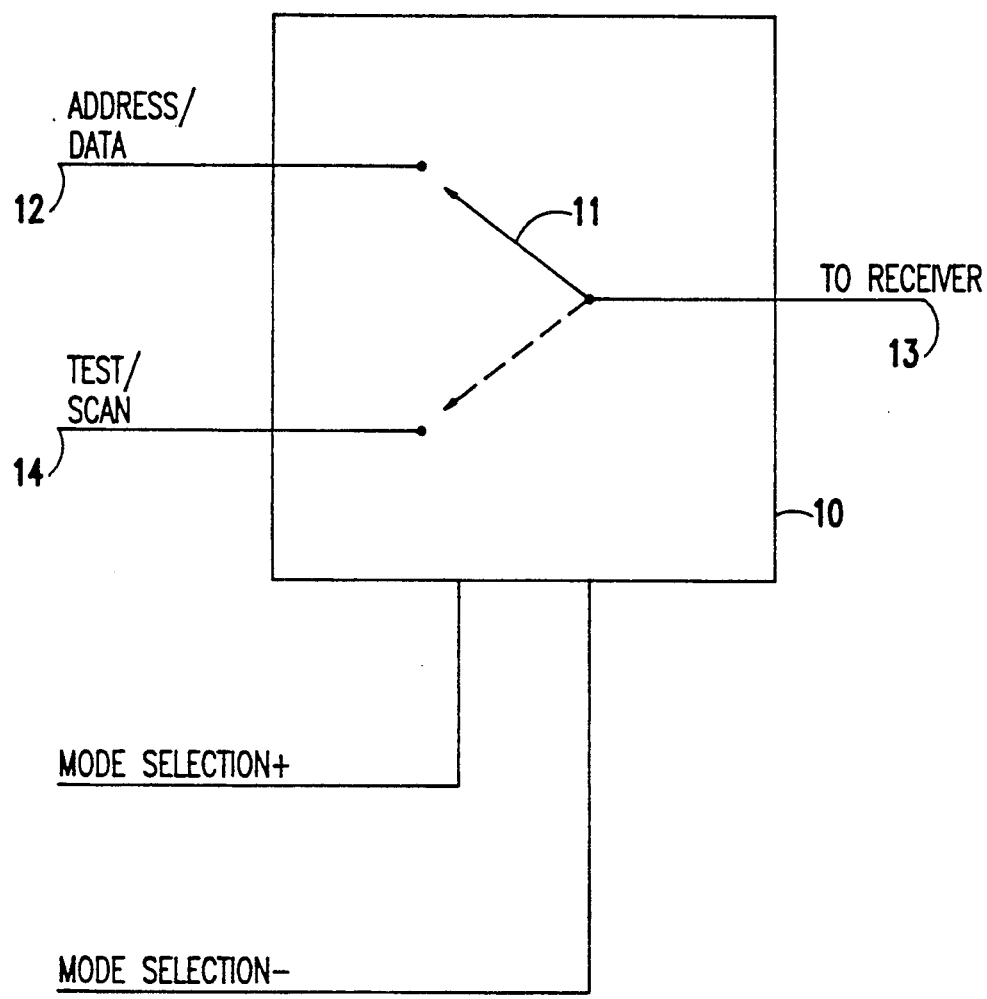
FIG. 1 is a high level block diagram showing the inputs and function of the high speed multiplexer according to the invention.

Referring now to the drawings, and more particularly to FIG. 1, the high speed multiplexer 10 according to the invention uses input selector circuits, represented by switch 11, that pass address or data from input terminal 12 into receiver circuits attached to output terminal 13 with minimal delay during system or test operation. The selector circuits 11 also isolate input terminal 12 and any associated network, terminator or pulldown from the receiver output terminal 13 during test mode to allow scan latches connected to input terminal 14 to drive the receivers without interference from input levels or terminator loading at input terminal 12. This feature is necessary to allow scanning a chip. The selector circuits 11 operate in two modes driven by two clock phases, denoted as MODE SELECTION+ and MODE SELECTION−. The multiplexer circuits are totally bipolar for high performance.

Figure 2:
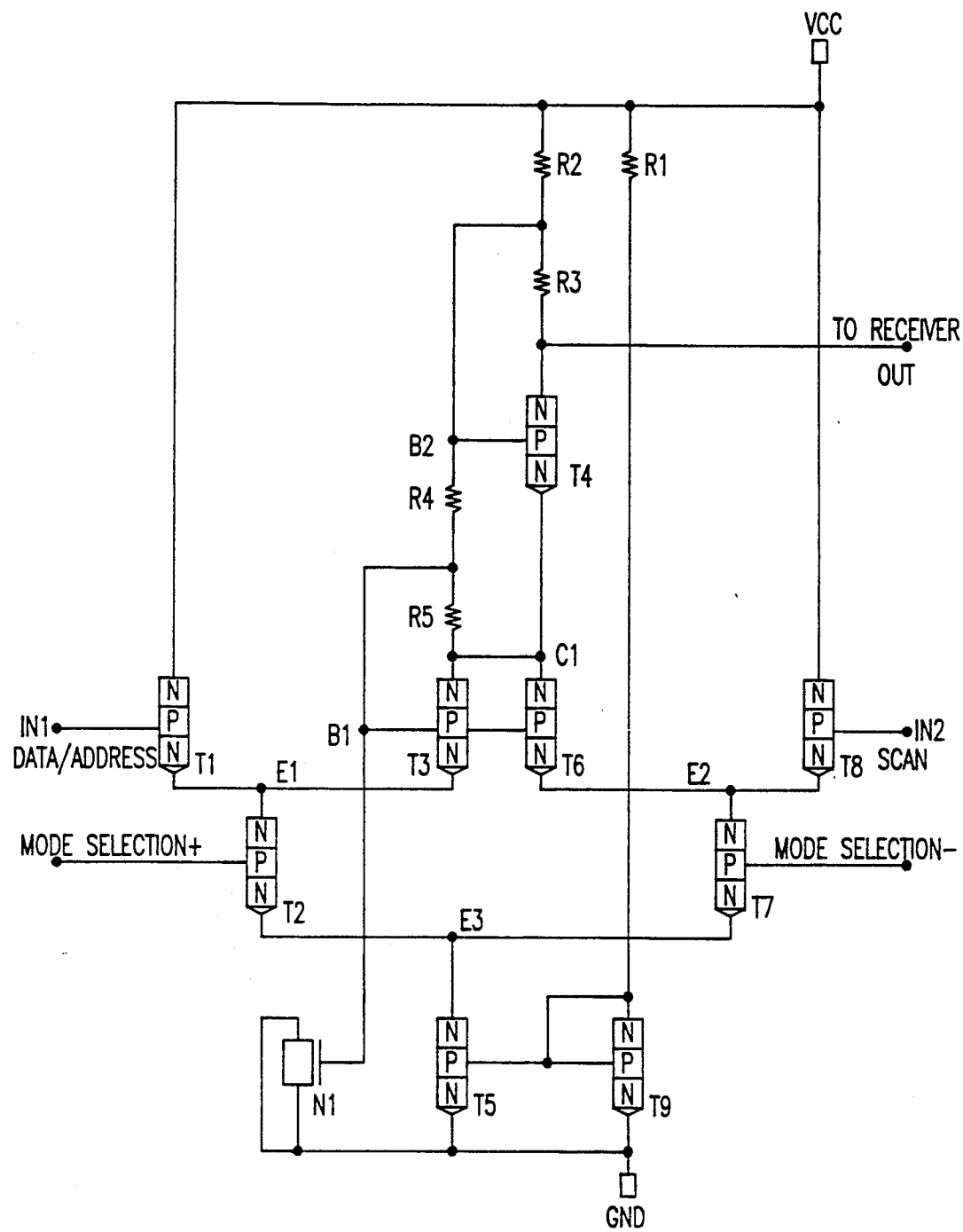
FIG. 2 is a detailed schematic circuit diagram showing a preferred embodiment of the high speed multiplexer.

A preferred embodiment of the multiplexer circuit, employing NPN bipolar transistors, is shown in FIG. 2. During system mode, the base of input emitter follower transistor $T_1$, node $IN_1$, connects to an address or data input terminal 12 where it receives $\simeq +1.8$ to $\simeq +2.6$ volt input from an off-chip address or data source, and its emitter connects through current steering device transistor $T_2$ and current source transistor $T_5$ to ground.

Diode connected current mirror device transistor $T_9$ drives current source transistor $T_5$. The emitter of transistor $T_1$ also connects to the emitter of level shift device transistor $T_3$ at node $E_1$. During system mode, the base of transistor $T_2$, node MODE SELECTION+, is at an up level and transistor $T_2$ is on.

Level shift device transistor $T_3$ is biased by resistors $R_4$ and $R_5$ for a $V_{CE}$ of $\simeq 400$ millivolts. Its collector node $C_1$ is connected to the emitter of transistor $T_4$ which is both a level shifting device and low gain linear amplifier (gain $\simeq 1.01$) that is biased by resistors $R_2$ and $R_3$ to have a collector-to-emitter voltage, $V_{CE}$, of $\simeq 400$ millivolts when node OUT, which is connected to output terminal 13, shown in FIG. 1 voltage level is up. The collector-to-emitter voltage, $V_{CE}$, of transistor $T_4$ is larger when the collector node OUT, at output terminal 13, voltage is at a down level resulting in the small voltage gain. The total voltage drop from the collector of transistor $T_4$, node OUT to the emitter of transistor $T_3$, node $E_1$ is $\simeq 800$ millivolts and can be adjusted by resistors $R_2$, $R_3$, $R_4$, and $R_5$ to exactly equal or slightly exceed the voltage drop from the base of transistor $T_1$, input node $IN_1$ to its emitter, node $E_1$ for both up and down level inputs independently. Thus, the circuit can be tailored to produce output levels that are exactly equal to or slightly greater than the input levels.

When the base of transistor $T_1$ node $IN_1$ is at a down level, current flows from power supply, $V_{CC}$, through resistors $R_2$ and $R_3$ and transistor $T_4$ and also through resistors $R_4$ and $R_5$ and transistors $T_3$, $T_2$ and $T_5$ to ground. The values of resistors $R_1$ and $R_2$ are chosen to produce higher current through transistor $T_5$ than through resistor $R_2$ which results in both the emitter node $E_1$ of transistor $T_1$ and output node OUT being pulled down until current also flows through transistor $T_1$ into transistor $T_2$ and clamps the emitter node $E_1$ at the input node $IN_1$ down level minus the base-to-emitter voltage, $V_{BE}$, of transistor $T_1$. Output node OUT will now be $\simeq 800$ millivolts higher than the emitter node of transistor $T_1$ (node $E_1$).

When the input $IN_1$ is at an up level, current still flows from power supply $V_{CC}$, through resistors $R_2$ and $R_3$, transistor $T_4$, resistors $R_4$ and $R_5$, and transistors $T_3$, $T_2$, and $T_5$ into ground, but the level at the emitter node of transistor $T_1$ is clamped at the input node $IN_1$ up level minus the base-to-emitter voltage, $V_{BE}$, of transistor $T_1$. Output node OUT will now be pulled down below $V_{CC}$ but only to the input node $IN_1$ up level minus the sum of the base-to-emitter voltage, $V_{BE}$, of transistor $T_1$, the collector-to-emitter voltage, $V_{CE}$, of transistor $T_3$, and the collector-to-emitter voltage, $V_{CE}$, of transistor $T_4$ (800 millivolts above node $E_1$). Device $N_1$ is an N-channel field effect transistor (NFET) having its source and drain both connected to ground and its gate connected to node $B_1$ to add capacitance to node $B_1$ which increases transient gain and thus improves performance. The added capacitance at node $B_1$ slows the movement of the base of transistor $T_3$ resulting in an increased transistor $T_3$ base-to-emitter voltage, $V_{BE}$, when node $E_1$ goes down and a decreased transistor $T_3$ base-to-emitter voltage, $V_{BE}$, when node $E_1$ goes up, which causes the collector-to-emitter voltage, $V_{CE}$, of transistor $T_3$ to become larger during an up-going transition, and smaller during a down-going transition.

While in system operating mode, transistor $T_2$ is turned on by an up level at mode select input node MODE SELECTION+ and transistor $T_7$ is turned off by a down level at mode select input node MODE SELECTION−. The emitter follower transistor $T_1$ and level shifting device transistors $T_3$ and $T_4$ that connect an address or data input node $IN_1$ to its receiver circuit node OUT introduces less than ten picoseconds of delay into the path since both the emitter follower device transistor $T_1$ and the level shifting device transistors $T_3$ and $T_4$ are always conducting and there is no switching threshold to overcome.

The system switches to test mode when the mode select clock MODE SELECTION+ goes to a down level and MODE SELECTION− goes to an up level. When mode select MODE SELECTION− is up, transistor $T_2$ is off, transistor $T_7$ is on and current flows through transistors $T_7$ and $T_5$ into ground. This disables transistor $T_1$ and it can no longer be affected by conditions at its base; however, transistor $T_7$ is now enabled and can receive scan test data.

With transistor $T_1$ disabled, the data or address on input terminal 11 at node $IN_1$, including terminator and network, are completely isolated from output node OUT which feeds the address or data receiver circuit input. Node OUT can now be controlled by multiplexer input $IN_2$ consisting of emitter follower transistor $T_8$, level shifter transistor $T_6$ which is dotted with transistor $T_3$, mode selector transistor $T_7$ and current source transistor $T_5$.

Figure 3:
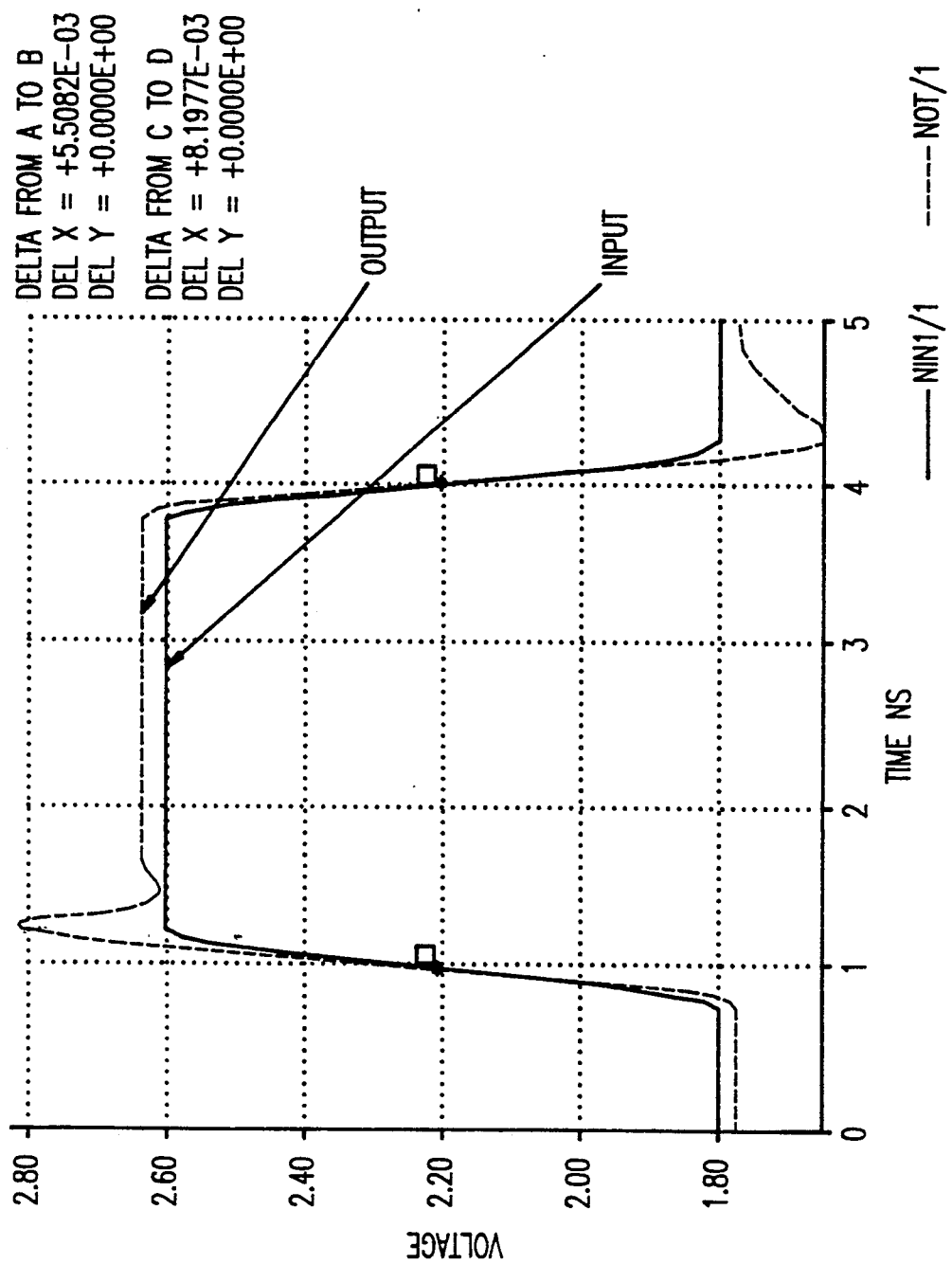
FIG. 3 is a graph showing the signal response of the circuit.

FIG. 3 shows a plot of the results of a simulation run. The multiplexer circuit output is loaded with two emitter coupled logic (ECL) fanouts and 0.04 pf capacitance, representing the receiver and latch loads and estimated wiring capacitance. As can be seen from the plot, minimum delay is introduced between input and output signals and, due to the low gain amplifier constituted by transistor $T_4$, there is no loss in signal level.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A high speed bipolar multiplexer circuit comprising:

first, second, third, and fourth bipolar transistors, said first and second transistors having a common emitter connection and said third and fourth transistors having a common emitter connection, collectors of said first and third transistors being connected to a source of voltage, a base of the first transistor being connected to a first input terminal, a base of the third transistor being connected to a second input terminal, and bases of the second and fourth transistors being connected in common;

fifth and sixth transistors having a common emitter connection, the fifth transistor having its collector connected to the common emitter connection of the first and second transistors and the sixth transistor having its collector connected to the common emitter connection of the third and fourth transistors, a base of the fifth transistor being connected to first mode selection terminal and a base of the sixth transistor being connected to a second mode selection terminal;

current source and current mirror transistors, said current source-transistor being connected between the common emitter connection of said fifth and sixth transistors and circuit ground and said current mirror transistor connected in series with a first resistor between said source of voltage and circuit ground and having common base connection with said current source transistor to drive said current source transistor; and a low-gain, linear amplifier including a seventh transistor and a voltage divider, said voltage divider being connected between said source of voltage and the common collector connection of said second and fourth transistors, said seventh transistor having an emitter connected to the common collector connection of the second and fourth transistors, a collector connected to an output terminal and through a portion of said voltage divider to said source of voltage, and a base connected to a first tap of said voltage divider establishing a bias level for the seventh transistor, said bases of the second and fourth transistors being connected to a second tap of said voltage divider to establish a bias level for said second and fourth transistors, said first, second and seventh transistors being always in a conductive state when said high-speed bipolar multiplexer is in a first mode of operation thereby minimizing a signal delay from said first input terminal to said output terminal and when said high-speed bipolar multiplexer is in a second mode of operation, said first transistor is non-conductive thereby isolating said first input terminal from said output terminal.

2. The high speed bipolar multiplexer circuit recited in claim 1 further comprising a capacitance device connected between the common connection of the bases of said second and fourth transistors and circuit ground, said capacitance device serving to increase transient gain of said low-gain, linear amplifier.

3. The high speed bipolar multiplexer circuit recited in claim 1 wherein said voltage divider comprises second, third, fourth and fifth resistors, said second, fourth and fifth resistors being connected in series between said source of voltage and the common connection of the collectors of said second and fourth transistors pairs, the junction between said second and fourth resistors being said first tap and the junction between said fourth and fifth resistors being said second tap, said second and third resistors being connected between said source of voltage and the collector of said seventh transistor.

4. The high speed bipolar multiplexer circuit recited in claim 3 wherein said second, third, fourth, and fifth resistors have values chosen to produce output levels at said output terminal equal to or slightly greater than input levels at said first input terminal.

5. The high speed bipolar multiplexer circuit recited in claim 4 wherein said first and second resistors have values chosen to produce a higher current through said fifth transistor than through said second resistor.

6. The high speed bipolar multiplexer circuit recited in claim 5 further comprising a field effect transistor connected as a capacitance device between the common connection of the bases of said second and fourth transistors and circuit ground, said capacitance device serving to increase transient gain of said low-gain, linear amplifier.

* * * * *